United States Patent
Chen et al.

(10) Patent No.: US 6,861,874 B1
(45) Date of Patent: Mar. 1, 2005

(54) INPUT/OUTPUT BUFFER

(75) Inventors: Sheng-Hua Chen, Kaohsiung (TW); Hung-Yi Chang, Hsinchu (TW); Jeng-Huang Wu, Taipei (TW)

(73) Assignee: Faraday Technology Corp. (TW)

( * ) Notice: Subject to any disclaimer, the term of this patent is extended or adjusted under 35 U.S.C. 154(b) by 0 days.

(21) Appl. No.: 10/679,399

(22) Filed: Oct. 7, 2003

(51) Int. Cl.$^7$ .......................................... H03K 19/0175
(52) U.S. Cl. ................................... 326/81; 326/83
(58) Field of Search .............................. 326/20, 27, 80, 326/81, 83, 86

(56) References Cited

U.S. PATENT DOCUMENTS

| | | | | |
|---|---|---|---|---|
| 5,635,861 A | * | 6/1997 | Chan et al. | 326/81 |
| 5,729,157 A | * | 3/1998 | Monk et al. | 326/80 |
| 5,880,602 A | * | 3/1999 | Kaminaga et al. | 326/81 |
| 5,973,511 A | * | 10/1999 | Hsia et al. | 326/81 |
| 6,300,800 B1 | * | 10/2001 | Schmitt et al. | 326/86 |

* cited by examiner

*Primary Examiner*—Jean JeanGlaude
*Assistant Examiner*—John B Nguyen
(74) *Attorney, Agent, or Firm*—Rabin & Berdo, P.C.

(57) ABSTRACT

An input/output buffer. An input/output circuit is composed of a first PMOS transistor and a first NMOS transistor, has an I/O port coupled to an I/O pad, and a N-well region. An N-well control circuit controls the voltage level at the N-well region of the first PMOS transistor according to input signals at the I/O pad. A P-gate control circuit receives a second gate control signal and outputs to the gate of the first PMOS transistor. The P-gate control circuit is composed of a transmission gate and a third PMOS transistor. The transmission gate and the third PMOS transistor do not have to follow the design rule for ESD, and the wafer area required for the P-gate control circuit can be decreased because the P-gate control circuit is not directly connected to the I/O pad.

9 Claims, 4 Drawing Sheets

INPUT/OUTPUT BUFFER

BACKGROUND OF THE INVENTION

1. Field of the Invention

The present invention relates to an input/output buffer, and more particularly, to an input/output buffer capable of occupying reduced wafer area.

2. Description of the Related Art

Conventionally, most IC devices are driven by a system voltage in the range of 0–5V. In these IC devices, the high-voltage logic signals are therefore set at the system voltage and the low-voltage logic signals are set at the ground voltage. With advances in semiconductor technology, however, the system voltage can be now reduced to 3.3V because the gate oxide layers in the IC device are thinner. Still lower system voltage may be possible in the future. In practice, however, an New 3.3V IC device is usually used in conjunction with some older 5V peripheral devices. For instance, an New 3.3V VGA (video graphic adapter) IC may be used in conjunction with other older 5V peripheral devices in a personal computer. Compatibility between the new 3.3V devices and the older 5V devices can thus be a problem.

FIG. 1 is a schematic circuit diagram showing the circuit structure of a conventional I/O buffer 14 used in a 3.3V IC device. As shown, the I/O buffer 14 is coupled to an input buffer 16 and an I/O pad 20 of an IC device. The I/O buffer 14 is composed of a first circuit 10, a second circuit 12, a PMOS transistor P1, and an NMOS transistor N1. When the I/O buffer operates in input mode, both the PMOS transistor P1 and the NMOS transistor N1 must be switched to a non-conducting state. To do this, the first circuit 10 outputs a high-voltage signal, for example 3.3V, to the gate of the PMOS transistor P1, thereby switching the PMOS transistor P1 to a non-conducting state. Meanwhile, the second circuit 12 outputs a low-voltage signal, for example 0V, to the gate of the NMOS transistor N1, thereby switching the NMOS transistor N1 to a non-conducting state.

However, if the I/O pad 20 receives a 5V input logic signal, it subjects the PMOS transistor P1 to a gate voltage of 3.3V, a drain voltage of 5V, and a source voltage of 3.3V. Since the gate voltage (3.3 V) is lower than the drain voltage (5 V) at the PMOS transistor P1, the gate voltage switches the PMOS transistor P1 to a reverse conducting state. Moreover, since the PMOS transistor P1 is formed on an N-type substrate and its source and drain are both P-type, a PN junction diode is formed between its drain and the N-well. Furthermore, since the drain of the PMOS transistor P1 is connected to the I/O pad 20, now receiving the 5 V input logic signal, higher than the 3.3V system voltage, and the substrate thereof is connected to the 3.3V system voltage, the PN junction diode is subjected to a forward bias, causing an undesired large current to flow between the external 5V source and the internal 3.3V source.

As a solution, an improved I/O buffer for the 3.3V IC is disclosed. FIG. 2 is a schematic diagram showing an I/O buffer capable of accepting an input logic signal voltage higher than the system voltage. The P-gate control circuit 32 conveys the first gate control signal Vp to the PMOS transistor Q3 of the I/O circuit. The N-well control circuit 34 adjusts the voltage at the floating N-well of the PMOS transistor Q3 according to the input voltage at the I/O pad 36. Undesired current leakage is thus prevented. In this I/O buffer, however, transistors Q5 and Q6 are required to follow design rules for electrostatic discharge (ESD) protection because the transistors Q5 and Q6 of the P-gate control circuit 32 are connected to the I/O pad 36 directly. Thus, it occupies a larger wafer area.

SUMMARY OF THE INVENTION

It is therefore an object of the present invention to protect I/O buffer from undesired current leakage when accepting an input logic signal voltage higher than the system voltage.

According to the above mentioned object, the present invention provides an I/O buffer capable of occupying reduced wafer area.

In the I/O buffer of the present invention, an input/output circuit has a first PMOS transistor, and a first NMOS transistor. The input/output circuit has an I/O pot coupled to an I/O pad. The first PMOS transistor has a N-well region, a gate receiving a first gate control signal, and a drain serving as the I/O port. A N-well control circuit controls the voltage level at the N-well region of the first PMOS transistor according to the input signals at the I/O pad. A P-gate control circuit receives a second gate control signal and outputs to the gate of the first PMOS transistor. The P-gate control circuit is composed of a transmission gate and a third PMOS transistor. The transmission gate and the third PMOS transistor do not follow the design rule for ESD, and the required wafer area for P-gate control circuit can be decreased because the P-gate control circuit is not directly connected to the I/O pad.

When the I/O buffer operates in input mode, if the input signal to the transmission terminal is 5V higher than the system voltage of 3.3V, the N-well control circuit 130 adjusts the voltage level at the N-well region of the first PMOS transistor to the voltage level of 5V. When the voltage state at the transmission terminal is switched from 5V to 0V, lower than the system voltage of 3.3V, the N-well control circuit adjusts the voltage level at the N-well region of the first PMOS transistor to the voltage level of the system voltage (3.3 V). Thus, undesired current leakage is prevented.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

Figure 1:
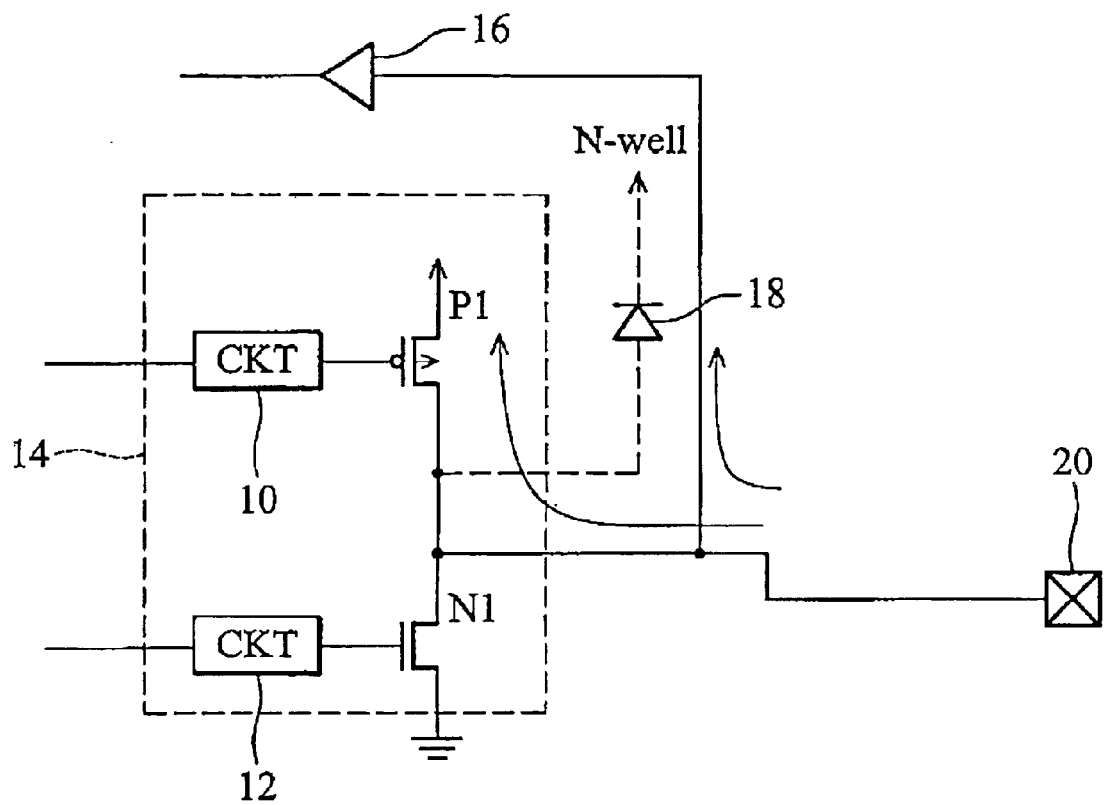
FIG. 1 is a diagram of a conventional input/output buffer.
Figure 2:
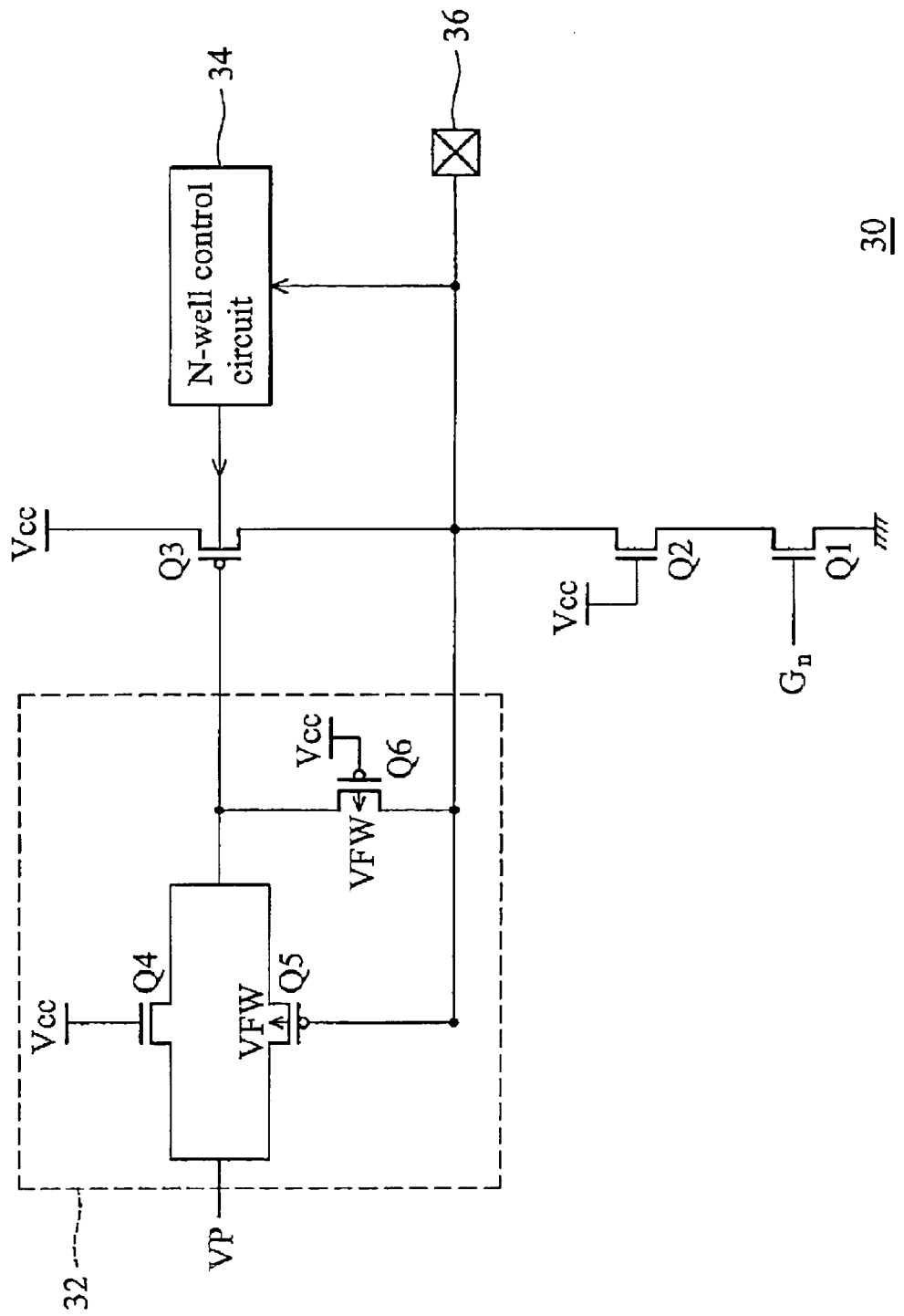
FIG. 2 is a schematic diagram showing a conventional I/O buffer capable of accepting an input logic signal voltage higher than the system voltage.
Figure 3:
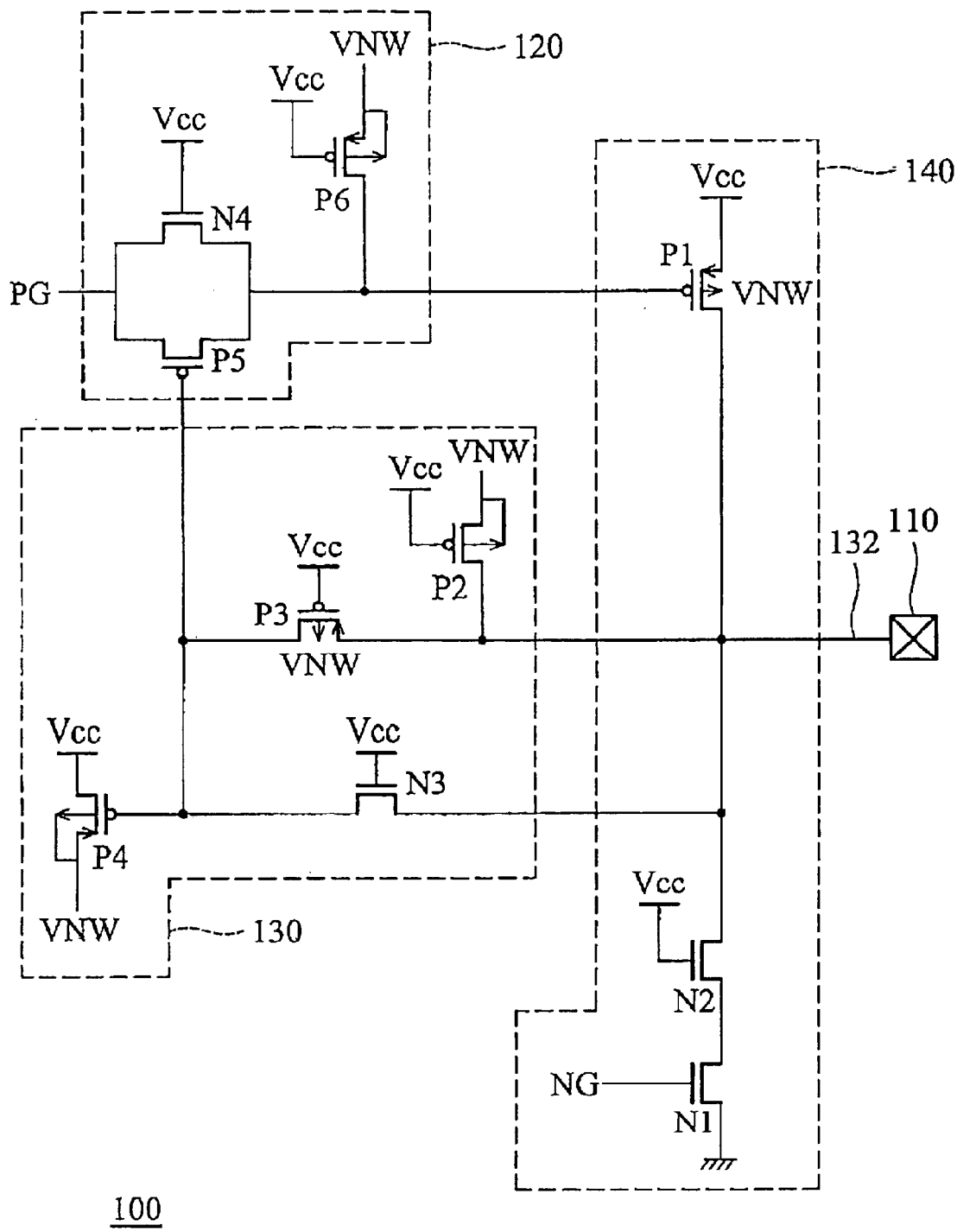
FIG. 3 is a schematic diagram showing the circuit structure of the I/O buffer according to the present invention.

FIG. 3 is a schematic diagram showing the circuit structure of the I/O buffer according to the present invention. This I/O buffer 100 is capable of accepting an input logic signal higher than the system voltage VCC. In the following embodiment of the present invention, the system voltage VCC is 3.3V, and the input logic signal switches between 0V and 5V, wherein the 5V high-voltage logic state is higher than the system voltage VCC of 3.3V. However, it is to be understood that the invention is not limited to this embodiment.

As shown in FIG. 3, the I/O buffer 100 has an I/O circuit 140, a P-gate control circuit 120 and a N-well control circuit 130. The I/O buffer 100 is connected to an I/O pad 110 of the IC device (not shown) through an I/O port 132. The operating of the I/O buffer 100 is controlled by two gate control signals PG and NG from the core circuit (not shown).

In this embodiment, the I/O circuit 140 is composed of a PMOS transistor P1 and two NMOS transistors N1 and N2. In the I/O circuit 140, the PMOS transistor P1 has a source coupled to the system voltage VCC, a drain coupled to the I/O pad through the I/O port 132, and a floating N-well region VNW. The NMOS transistor N1 has a gate coupled to the first gate control single NG from the core circuit (not shown), a source coupled to the ground. The NMOS transistor N2 has a gate coupled to the system voltage VCC, a drain coupled to the I/O pad through the I/O port 132, and a source coupled to the drain of the NMOS transistor N1.

In this embodiment, the P-gate control circuit 120 is composed of a transmission gate and a PMOS transistor P6, wherein the transmission gate has a NMOS transistor N4 and a PMOS transistor P5. The P-gate control circuit 120 receives a second gate control signal PG from the core circuit (not shown) and outputs to the gate of the PMOS transistor P1.

In the P-gate control circuit 120, the PMOS transistor P6 has a gate coupled to the system voltage VCC, a source coupled to the floating N-well region of the PMOS transistor P1, and a drain coupled to the gate of the PMOS transistor P1. The PMOS transistor P5 has a source coupled to the second gate control signal PG, and a drain coupled to the gate of the PMOS transistor P1 and the drain of the PMOS transistor P6. The NMOS transistor N4 has a gate coupled to the system voltage VCC, a source coupled to the second gate control signal PG, and a drain coupled to the gate of the PMOS transistor P1.

In this embodiment, the N-well control circuit 130 is composed of three PMOS transistors P2~P4 and a NMOS transistor N3. The N-well control circuit 130 adjusts the voltage level at the floating N-well region VNW of the PMOS transistor P1 according to the input voltage at the I/O pad 110 when the I/O buffer 100 operates in input mode. In the N-well control circuit 130, the NMOS transistor N3 has a drain coupled to I/O pad 110, and a gate coupled the system voltage VCC. The PMOS transistor P2 has a source coupled to the I/O pad 110 through the I/O port 132, a gate coupled to the system voltage VCC, and a drain coupled to the floating N-well region VNW. The PMOS transistor P3 has a gate coupled to the system voltage VCC, a source coupled to the I/O pad 110 through the I/O port 132, and a drain coupled to the source of the NMOS transistor N3. The PMOS transistor P4 has a drain coupled to the system voltage VCC, a source coupled to the floating N-well region VNW, and a gate coupled to the source of the NMOS transistor N3 and the drain of the PMOS transistor P3. Furthermore, the floating N-well region VNW is connected to the substrate on which all PMOS transistors P1~P6 are formed.

When the I/O buffer 100 operates in input mode, the gate control signal NG is in a low-voltage state, and the NMOS transistor N1 is turned off. At the same time, the gate control signal PG is in a high-voltage state, and the PMOS transistor P1 is turned off. If the input signal to the I/O port 132 is 5V higher than the system voltage of 3.3V, it can be transferred into the floating N-well region VNW through the PMOS transistor P2 because the PMOS transistor P2 is now in a conducting state due to its gate voltage being connected to the 3.3V system voltage VCC lower than its drain voltage of 5V connected to the I/O port 132. Thus, the floating N-well region VNW is set at 5V. Furthermore, the PMOS transistor P3 is turned on also, the input signal of 5V is transferred into the gates of the PMOS transistors P4 and P5 through the PMOS transistor P3 and NMOS transistor N3, thus turning on the PMOS transistors P4 and P5. In addition, the PMOS transistor P6 is now in a conducting state due to its gate voltage being connected to the 3.3V system voltage VCC lower than its source voltage of 5V connected to the floating N-well VNW.

When the voltage state at the I/O port 132 is switched from 5V to 0V, the PMOS transistors P2 and P3 are both tuned off. Further, the input signal of 0V is transferred into the gate of the PMOS transistor P4 through the NMOS transistor N3, thus turning on the PMOS transistor P4. As a result, the floating N-well is set at system voltage VCC. Undesired current leakage is thus prevented.

Therefore, the present invention can accept an input logic signal voltage higher than the system voltage, and prevent undesired current leakage. Further, in the present invention the transmission gate and the third PMOS transistor do not have to follow the design rule for electrostatic discharge (ESD) protection, and the wafer area required the for P-gate control circuit can be decreased because the P-gate control circuit is not directly connected to the I/O pad. Thus, it conserves wafer area.

Figure 4:
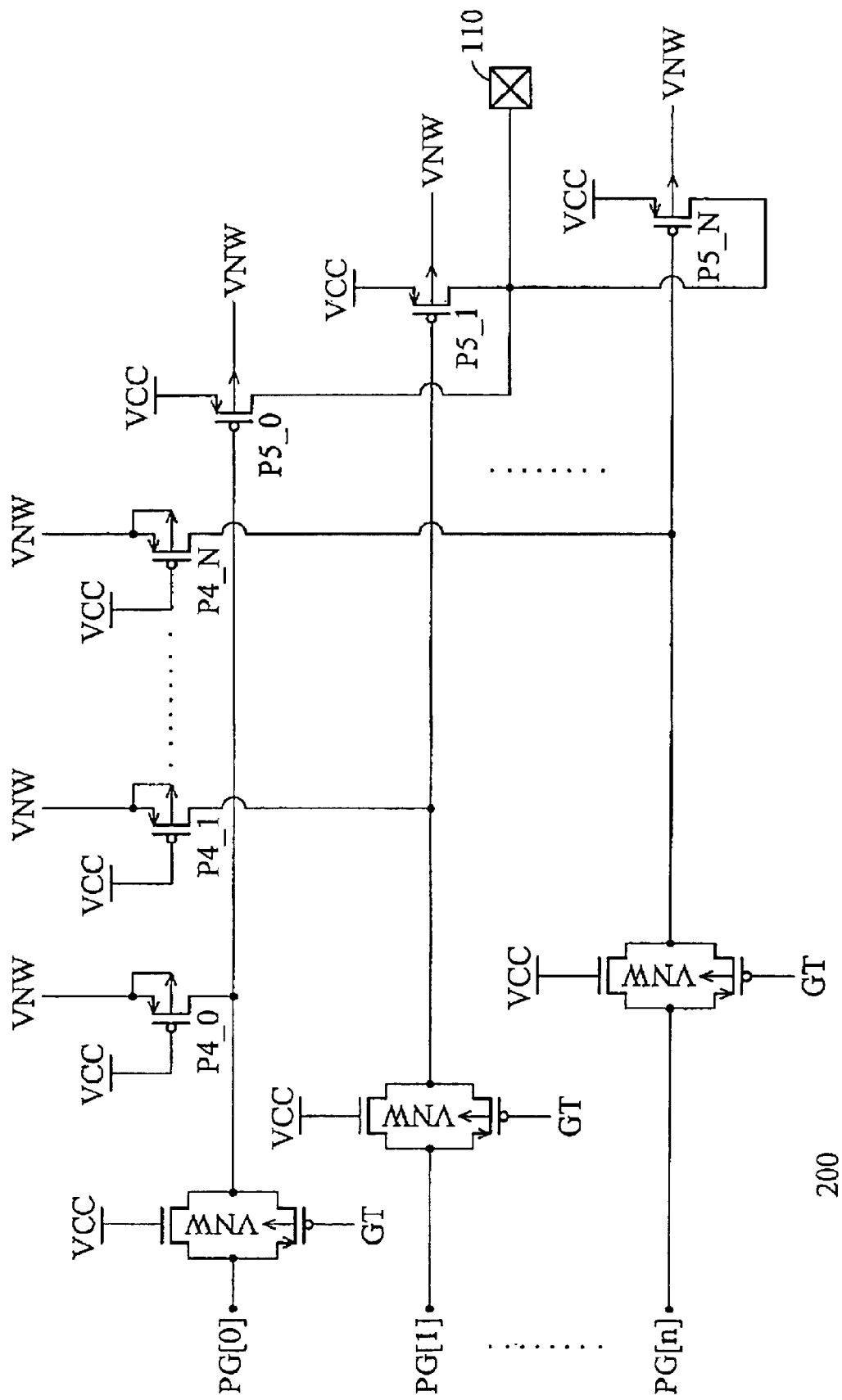
FIG. 4 shows a circuit with a plurality of PMOS drivers according to the present invention.

FIG. 4 is another embodiment of the I/O buffer according to the present invention. In this case, the circuit 200 includes a plurality of PMOS drivers, each having a transmission gate and two corresponding PMOS transistors, wherein all drains of the PMOS transistors (P5_0~P5_N) are connected to the I/O pad 110. Further, each of the PMOS transistors (P4_0~P4_N) has a gate coupled to system voltage VCC, a source coupled to the floating N-well region VNW, and a drain coupled to the gate of the corresponding PMOS transistor. The PMOS transistors (P4_0~P4_N) do not have to follow the design rule for ESD protection because they are not connected to the I/O pad directly. Thus, when using a plurality of PMOS drives, wafer area conservation is more pronounced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A feedback control I/O buffer driven by a system voltage, comprising:

an input/output circuit comprising a first PMOS transistor and a first NMOS transistor and having an I/O port coupled to an I/O pad, wherein the first PMOS transistor has an N-well region, a gate of the first NMOS transistor receives a first gate control signal, and a drain of the first PMOS transistor serves as the I/O port;

a P-gate control circuit receiving a second gate control signal and being output to the gate of the first PMOS transistor, wherein the P-gate control circuit comprises:

a transmission gate having a second NMOS transistor and a second PMOS transistor, the sources of which are coupled to the second gate control signal, and the gates of which are coupled to the system voltage and the N-well control circuit respectively; and a third PMOS transistor having a drain and a source coupled to the gate and the floating N-well region of the first PMOS transistor respectively, and a gate coupled to the system voltage; and an N-well control circuit coupled to the I/O pad to control the voltage level at the N-well region of the first PMOS transistor according to a feedback signal output from an inverter, wherein the N-well control circuit comprises:

a fourth PMOS transistor having a source coupled to the I/O pad, a gate coupled to the system voltage, and a drain coupled to the N-well region of the first PMOS transistor;

a fifth PMOS transistor having a gate coupled to the system voltage, a source coupled to the I/O pad, and a drain;

a sixth PMOS transistor having a gate coupled to the drain of the fifth PMOS transistor, a drain coupled to the system voltage, and a source coupled to the N-well region of the first PMOS transistor; and a third NMOS transistor having a source and drain coupled to the I/O pad and the gate of the sixth PMOS transistor, and a gate coupled to the system voltage.

2. The feedback control I/O buffer as claimed in claim 1, wherein the N-well control circuit adjusts the voltage level at the N-well region of the first PMOS transistor to the voltage level of the input voltage when the input voltage exceeds the system voltage.

3. The feedback control I/O buffer as claimed in claim 2, wherein the N-well control circuit adjusts the voltage level at the N-well region of the first PMOS transistor to the voltage level of the system voltage when the input voltage is lower than the system voltage.

4. The feedback control I/O buffer as claimed in claim 1, wherein the input/output circuit further comprises a fourth NMOS transistor having a source and drain coupled to the I/O pad and the drain of the first NMOS transistor respectively, and a gate coupled to the system voltage.

5. An input/output buffer, comprising:

a floating N-well;

a first NMOS transistor having a gate coupled to a first gate control signal, and a source coupled to the ground;

a second NMOS transistor having gate coupled to a system voltage, a source coupled to a drain of the first NMOS transistor and a drain coupled to an I/O pad;

a third NMOS transistor having a gate coupled to the system voltage, and a drain coupled to the I/O pad;

a first PMOS transistor having a source coupled to the system voltage, and a drain coupled to the I/O pad;

a second PMOS transistor having a source coupled to the I/O pad, a gate coupled to the system voltage, and a drain coupled to the floating N-well;

a third PMOS transistor having a source coupled to the I/O pad, a gate coupled to the system voltage, and a drain coupled to a source of the third NMOS transistor;

a fourth PMOS transistor having a gate coupled the drain of the third PMOS transistor, a drain coupled to the system voltage, and a source coupled to the floating N-well;

a transmission gate including a fifth PMOS transistor and a fourth NMOS transistor, wherein the sources of which are coupled to a second gate control signal, the drains of which are coupled to the gate of the first PMOS transistor, and the gates of which are coupled to a drain of the third PMOS transistor and the system voltage respectively; and a sixth PMOS transistor having a gate coupled to the system voltage, a drain coupled to the gate of the first PMOS transistor and a source coupled to the floating N-well and the source of the fourth PMOS transistor; wherein the floating N-well is connected to the substrate on which the first to sixth PMOS transistors are formed.

6. A feedback control I/O buffer driven by a system voltage, comprising:

an input/output circuit comprising a first PMOS transistor and a first NMOS transistor and having an I/O port coupled to an I/O pad, wherein the first PMOS transistor has an N-well region, a gate of the first NMOS transistor receives a first gate control signal, and a drain of the first PMOS transistor serves as the I/O port;

a P-gate control circuit receiving a second gate control signal and being output to the gate of the first PMOS transistor; and a N-well control circuit coupled to I/O pad to control the voltage level at the N-well region of the first PMOS transistor according to a feedback signal output from an inverter, wherein the N-well control circuit comprises:

a second PMOS transistor having a source coupled to the I/O pad, a gate coupled to the system voltage, and a drain coupled to the N-well region of the first PMOS transistor;

a second NMOS transistor having a drain coupled to the I/O pad, a gate coupled to the system voltage, and a drain;

a third PMOS transistor having a gate coupled to the system voltage, a source coupled to the I/O pad, and a drain coupled to the source of the second NMOS transistor; and a fourth PMOS transistor having a gate coupled to the drain of the third PMOS transistor, a drain coupled to the system voltage, and a source coupled to the N-well region of the first PMOS transistor.

7. The feedback control I/O buffer as claimed in claim 6, wherein the N-well control circuit adjusts the voltage level at the N-well region of the first PMOS transistor to the voltage level of the input voltage when the input voltage exceeds the system voltage.

8. The feedback control I/O buffer as claimed in claim 6, wherein the N-well control circuit adjusts the voltage level at the N-well region of the first PMOS transistor to the voltage level of the system voltage when the input voltage is lower than the system voltage.

9. The feedback control I/O buffer as claimed in claim 6, wherein the input/output circuit further comprises a fourth NMOS transistor having a source and drain coupled to the I/O pad and the drain of the first NMOS transistor respectively, and a gate coupled to the system voltage.

* * * * *